(12) United States Patent
Tu (10) Patent No.: US 7,851,861 B2
(45) Date of Patent: Dec. 14, 2010

(54) MIM CAPACITOR AND METAL GATE TRANSISTOR

(75) Inventor: Kuo-Chi Tu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 257 days.

(21) Appl. No.: 11/655,855

(22) Filed: Jan. 22, 2007

(65) Prior Publication Data

US 2008/0173978 A1 Jul. 24, 2008

(51) Int. Cl.
*H01L 27/01* (2006.01)
*H01L 27/12* (2006.01)
*H01L 31/0392* (2006.01)
*H01G 2/00* (2006.01)

(52) U.S. Cl. ............... 257/350; 257/351; 257/E21.008; 257/E31.001; 361/271

(58) Field of Classification Search ................. 438/393; 257/350, 351, 277, 296, 298, 300, 532, E21.008, 257/E21.176, E21.444, E21.648, E21.651, 257/E21.653, E21.654, E27.008, E27.016, 257/E27.024, E27.025, E27.03, E27.033, 257/E27.034, E29.343, E31.001; 361/271

See application file for complete search history.

(56) References Cited

U.S. PATENT DOCUMENTS

| 5,633,181 | A | * | 5/1997 | Hayashi | 438/234 |
| 5,683,931 | A | * | 11/1997 | Takahashi | 438/253 |
| 5,793,076 | A | * | 8/1998 | Fazan et al. | 257/298 |
| 6,184,551 | B1 | * | 2/2001 | Lee et al. | 257/310 |
| 6,406,956 | B1 | * | 6/2002 | Tsai et al. | 438/201 |
| 6,787,836 | B2 | * | 9/2004 | Clevenger et al. | 257/296 |
| 7,045,785 | B2 | * | 5/2006 | Iida et al. | 250/338.1 |
| 7,071,529 | B2 | * | 7/2006 | Miyagawa et al. | 257/501 |
| 7,288,807 | B1 | * | 10/2007 | Akamatsu | 257/296 |
| 2005/0275005 | A1 | * | 12/2005 | Choi et al. | 257/300 |
| 2006/0024899 | A1 | * | 2/2006 | Crenshaw et al. | 438/381 |

OTHER PUBLICATIONS

K.H. Buschow, Robert Cahn, Merton Flemings, Bernhard Ilschner, Edward J. Kramer, and Subhash Mahajan, eds. "Encyclopedia of materials: science and technology", 2001, Elsevier, vol. 7 Ni-Poi, p. 6772.*

* cited by examiner

*Primary Examiner*—David S Blum
(74) *Attorney, Agent, or Firm*—Birch, Stewart, Kolasch & Birch, LLP (57) ABSTRACT

A device includes an embedded MIM capacitor and a transistor formed in parallel with reduced processing steps and improved device performance in different regions of a substrate. The embedded MIM capacitor has a bottom electrode, an insulator layer, a dielectric film, and a top electrode. The substrate has an insulator region. The bottom electrode, having a first conductor, overlies the insulator region. The insulator layer overlies the substrate and the bottom electrode. The insulator layer has an opening connecting parts of the bottom electrode. The dielectric film lines the opening, and is disposed directly on the bottom electrode and sidewalls of the opening. The top electrode, having a second conductor, overlies the dielectric film in the opening. The dielectric film lines sidewalls and bottom of the top electrode.

20 Claims, 5 Drawing Sheets

MIM CAPACITOR AND METAL GATE TRANSISTOR

BACKGROUND OF THE INVENTION

1. Field of the Invention

This invention relates to metal-insulator-metal (MIM) capacitor structures and more particularly to a device comprising an MIM capacitor structure and adjacent metal gate electrode CMOS transistor and a method for forming the same in parallel to reduce a processing cost, improve a process flow, and improve both MIM capacitor and CMOS transistor performance in high speed applications.

2. Description of the Related Art

Advances in technology have resulted in an increasing demand for system-on-chip products where both analog and digital signal processing are desirable. Increasingly it is advantageous for both the analog circuitry and digital circuitry to be in close proximity. For example, digital and analog circuitry blocks operating together are referred to as mixed mode systems.

Polysilicon-insulator-polysilicon (PIP) capacitors are well known in the art and have been used in conventional mixed mode systems. Formation of PIP capacitors is, however, problematic in CMOS process technologies used to form a logic circuit on an adjacent region of a chip. In addition, PIP capacitors have unacceptable performance including unstable capacitance with varying applied voltages, primarily due to carrier depletion effects. Moreover, PIP capacitors have the additional shortcoming of difficult scale down as well as exhibiting poor performance in high speed applications. Thus, these and other shortcomings make PIP capacitors undesirable for use in future mixed mode circuitry applications.

Metal-insulator-metal (MIM) capacitors have been found to have improved performance over PIP capacitors. Several conventional difficulties conventional processes remain to be overcome. For example, MIM capacitors are generally formed as BEOL processes, adding to processing steps and cost, as well as presenting process integration challenges with both FEOL and BEOL CMOS processes including damascene interconnect processes.

Many analog and mixed mode systems rely on precise reproducibility in the electronic properties of circuit component structures, such as MIM capacitor structures, to achieve the electrical matching of the various circuitry components. Electronic mismatching of circuitry components results in degraded signal processing quality and is adversely affected by deviations in critical dimensions between components. Critical dimension deviation is typically exacerbated by the increased number of processing steps required for producing a component, such as a MIM capacitor in a BEOL process.

Thus, an improved MIM capacitor structure and manufacturing process achieving reduced cost and improved performance of both MIM capacitors and CMOS transistors including mixed mode systems is desirable.

BRIEF SUMMARY OF THE INVENTION

The invention provides devices comprising a capacitor and a transistor and methods of forming the same.

The invention provides a device comprising a substrate, a bottom electrode, a dielectric film, and a top electrode. The substrate comprises an insulator region. The bottom electrode comprises a first conductor and overlies the insulator region. The dielectric film overlies the bottom electrode, remaining parts of the bottom plate exposed. The top electrode comprises a second conductor and overlies the dielectric film. The dielectric film lines sidewalls and bottom of the top electrode.

The invention further provides a device comprising a capacitor and a transistor. The device comprises a substrate, a bottom electrode, a dielectric film, a second metal, and an insulator layer. The substrate comprises a mixed mode region adjacent to a logic circuit region. The bottom electrode comprises a first metal and overlies an insulator region in the mixed mode region. The dielectric film overlies the bottom electrode and a semiconductor region in the logic circuit region, respectively acting as a capacitor dielectric film and a gate dielectric. The second metal overlies the dielectric film, respectively acting as a top electrode of a capacitor structure in the mixed mode region and a real gate electrode of a transistor structure in the logic circuit region. The dielectric film lines sidewalls of the top electrode and the real gate electrode. The insulator layer overlies the capacitor structure and the transistor structure.

The invention further provides a method for forming a device comprising a capacitor and a transistor. A substrate is first provided. The substrate comprises an insulator region adjacent to a semiconductor region. A bottom electrode is then formed on the insulator region. The bottom electrode comprises a first conductor. A dielectric film is then formed on the bottom electrode and the semiconductor region, respectively acting as a capacitor dielectric film and a gate dielectric. Finally, a second conductor is formed on the capacitor dielectric film and the gate dielectric, respectively acting as a top electrode of a capacitor structure and a real gate electrode of a transistor structure.

The invention further provides a method for forming a device comprising a capacitor and a transistor. A substrate is first provided. The substrate comprises an insulator region adjacent to an active region. A bottom electrode is then formed on the insulator region. The bottom electrode comprises a first conductor. A first gate structure is then formed on the bottom electrode while simultaneously forming a second gate structure on the active region. Gate electrode portions of the first and second gate structures are then removed, respectively forming a first and a second opening, respectively exposing the bottom electrode and the semiconductor region. A dielectric film is formed, lining the first and second openings, forming a capacitor element on the bottom electrode while simultaneously forming a gate dielectric on the active region. Finally, a second conductor is formed, filling the first and second openings, respectively forming a top electrode of a capacitor structure and a real gate electrode of a transistor structure.

The invention further provides a device comprising a capacitor and a transistor. The device comprises a substrate, a bottom electrode, a dielectric film, and a second conductor. The substrate comprises an insulator region adjacent to a semiconductor region. The bottom electrode is disposed on the insulator region and comprises a first conductor. The dielectric film is disposed on the bottom electrode and the semiconductor region, respectively acting as a capacitor dielectric film and a gate dielectric. The second conductor is disposed on the capacitor dielectric film and the gate dielectric, respectively acting as a top electrode of a capacitor structure and a real gate electrode of a transistor structure.

Further scope of the applicability of the invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

While the embedded MIM capacitor structure and method for forming the same according to the invention is described with reference to an exemplary mixed mode device including an adjacent CMOS transistor (e.g., MOSFET) device (e.g., on the same chip), It will be appreciated by those skilled in the art that the method of the invention may be used in the formation of other devices including adjacent capacitors (charge storing devices) and transistors such as analog RF circuitry and DRAM devices, where an MIM capacitor structure and transistor gate structure are advantageously formed in parallel.

Figure 1A:
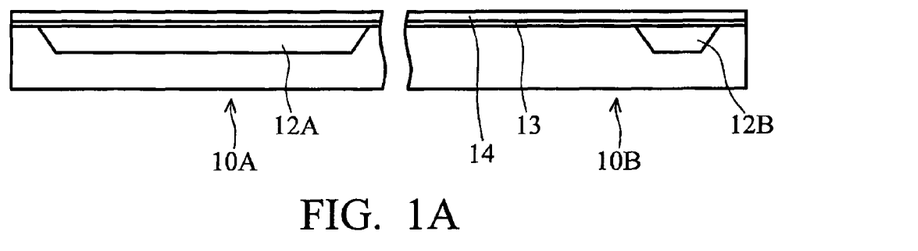
FIGS. 1A-1G are cross-sectional views of a portion of an exemplary device including an MIM structure and a CMOS device at processing stages according to an embodiment of the invention.

FIGS. 1A-1G show an exemplary embodiment of the invention at stages in manufacture in forming an embedded (mixed mode) MIM capacitor structure. FIG. 1A, for example, shows a semiconductor substrate (e.g., chip portion of a semiconductor processing wafer) including mixed mode region 10A juxtaposed with logic circuit region 10B to illustrate parallel processes. The semiconductor substrate may be any semiconductor. For example, the semiconductor substrate may include, but is not limited to, silicon, silicon on insulator (SOI), stacked SOI (SSOI), stacked SiGe on insulator (S—SiGeOI), SiGeOI, and GeOI, and combinations thereof.

Still referring to FIG. 1A, shown in the respective mixed mode 10A and logic region 10B are isolation (insulator) regions 12A and 12B, which may be shallow trench isolation (STI) structures, a LOCOS (local oxidation) region, or a filed oxide region formed by conventional thermal oxidation and/or CVD processes as are known in the art. A dummy gate dielectric material (e.g., silicon oxide) layer 13 is then formed over the substrate surface by conventional CVD and/or thermal oxide growth processes.

Still referring to FIG. 1A, a bottom conductor electrode material 14, preferably including a metal, is then formed over the dummy oxide layer 13 by conventional processes, including PVD, CVD, electrodeposition, or similar, as is appropriate for the material being deposited. The bottom electrode may be any metal containing conductor including W, WN, Ti, TiN, Mo, TaN, Cu, CuAl, and combinations thereof. Metals are preferred for reduced electrical resistance and high speed applications.

Figure 1B:
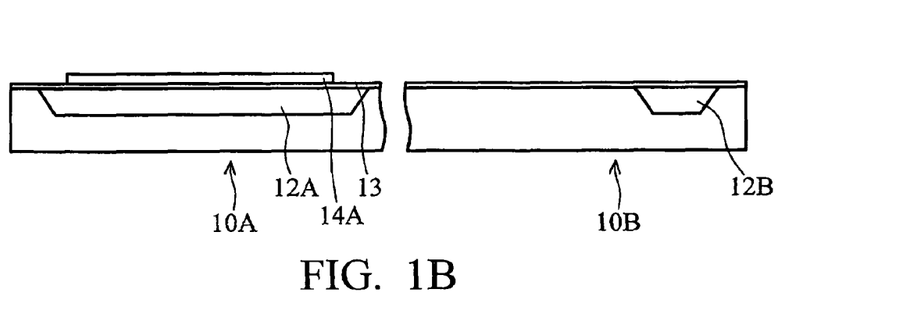

Referring to FIG. 1B, a conventional lithographic patterning and etching process is then carried out to pattern a bottom electrode portion 14A over the mixed mode region 10A of the substrate, while removing the bottom electrode material 14A over the logic region 10B of the substrate to expose the dummy dielectric layer 13. For example, a resist etching mask pattern (not shown) is first formed followed by an etching process. It will be appreciated by those skilled in the art that a dry and/or wet etching process may be used, preferably anisotropic, to pattern the bottom electrode portion 14A.

Figure 1C:
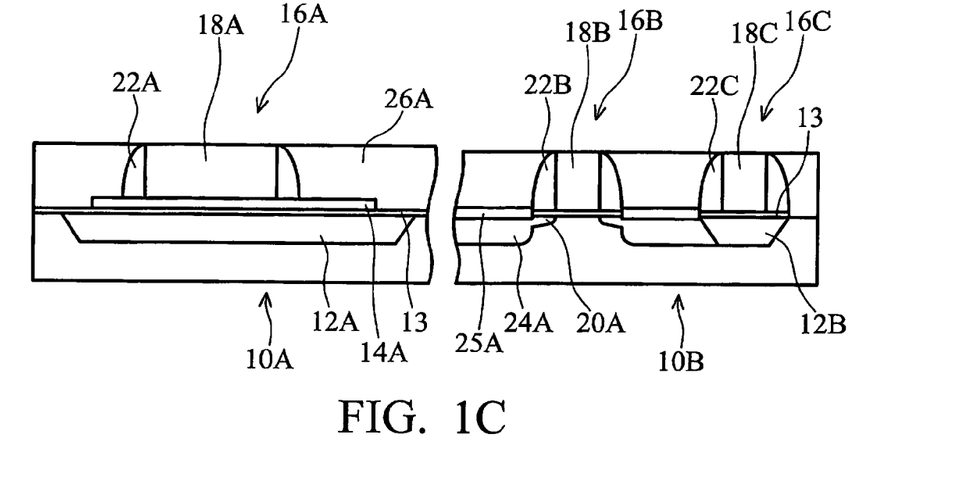

Referring to FIG. 1C, conventional CMOS manufacturing processes are then carried out to form a dummy gate structure e.g., 16A over the mixed mode region 10A of the substrate while simultaneously forming gate structures e.g., 16B and 16C over the logic region, 10B, of the substrate. For example, a gate electrode material such as polysilicon is deposited by conventional processes, e.g., PECVD, LPCVD, followed by a lithographic patterning and etching process to form sacrificial gate electrode portions e.g., 18A, 18B, 18C. LDD regions e.g., 20A are then formed adjacent either side of the active gate electrode portions, e.g., 18B, by an ion implantation process, followed by formation of sidewall spacers e.g., 22A, 22B, and 22C, on either side of the respective gate electrode portions to form respective gate structures 16A, 16B, and 16C. Source/drain regions, e.g., 24A are then formed by a conventional ion implantation process adjacent to either side of the sidewall spacers, e.g., 22B of the active gate structures e.g., 16B. Self-aligned silicide (salicide) regions, e.g. 25A may be optionally formed over the respective source/drain regions, e.g., 24A, by conventional processes e.g., forming a metal silicide such a $TiSi_2$ or $CoSi_2$.

It will be appreciated by those skilled in the art that ion implantation processes for forming LDD regions and source/drain regions need not be, and preferably are not, carried out for dummy gate structures e.g., 16A and 16C. For example, dummy gate structures having about the same dimensions as active gate structure 16B, such as 16C, may be formed on isolation (insulator) regions (e.g., 12B) of the logic region 10B adjacent active gate structure (e.g., 16B) to aid in anisotropic etching process window control as well as improving a planarizing process such as chemical mechanical polishing (CMP) in subsequent processes outlined in the following. It will also be appreciated by those skilled in the art that dummy gate structure 16A on the mixed mode region 10A, subsequently used to form an MIM capacitor structure, will be wider than the active gate structure 16A, for example by a factor of two or greater, to provide a sufficient capacitance value.

Still referring to FIG. 1C, a first insulator layer 26A, also referred to as a pre-metal dielectric (PMD) or interlevel dielectric (ILD), is then deposited over the process surface including substrate regions 10A and 10B, followed by a conventional CMP process to planarize the surface to form the insulator layer 26A about co-planar with and surrounding (adjacent) the gate structures. The insulator layer 26A may be an conventional insulator material such as doped or undoped silicon oxide formed by spin-on, CVD, or PECVD processes, including such materials such as BTEOS, PTEOS, BPTEOS, PE oxide as well as low-k dielectrics such as carbon doped oxide and organo-silane glass (OSG).

Figure 1D:
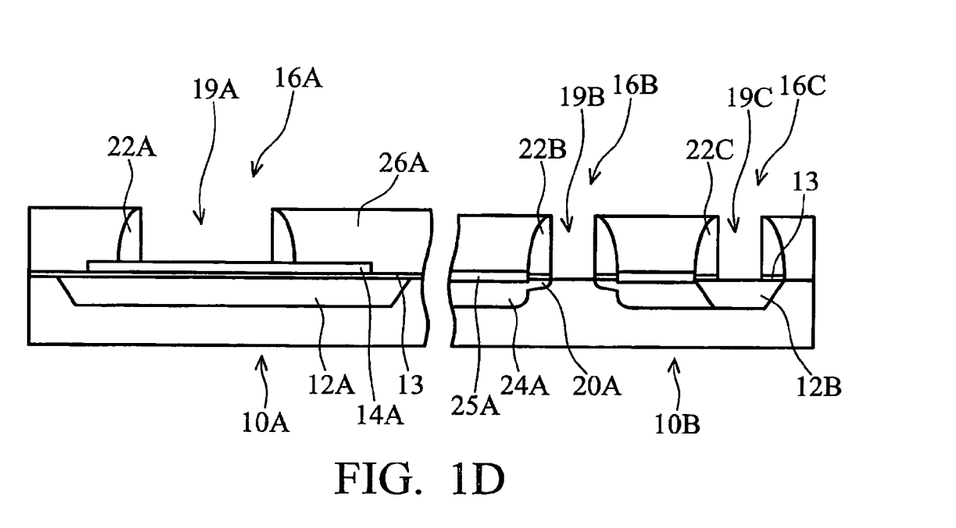

Referring to FIG. 1D, a plasma etching process is then carried out to selectively remove the gate electrode portions e.g., 18A, 18B, 18C of the respective gate structures, to form respective gate electrode openings e.g., 19A, 19B, and 19C. It will be appreciated by those skilled in the art by those skilled in the art that the process surface may be lithographically patterned to form a resist etching mask (not shown) prior to etching. The etching process is preferably a plasma etching process e.g., anisotropic reactive ion etching (RIE) process.

The etching process is carried out to expose the dummy dielectric layer 13 on the logic region 10A, and expose the bottom electrode 14A on the mixed mode region 10A. Following removal of the gate electrode material, a subsequent wet or dry etching process is carried out to remove the dummy dielectric (dummy oxide) layer 13 overlying the substrate at the bottom of gate electrode openings e.g., 19B and 19C, while leaving the bottom electrode 14A in place at the bottom of the gate electrode opening 19A.

Figure 1E:
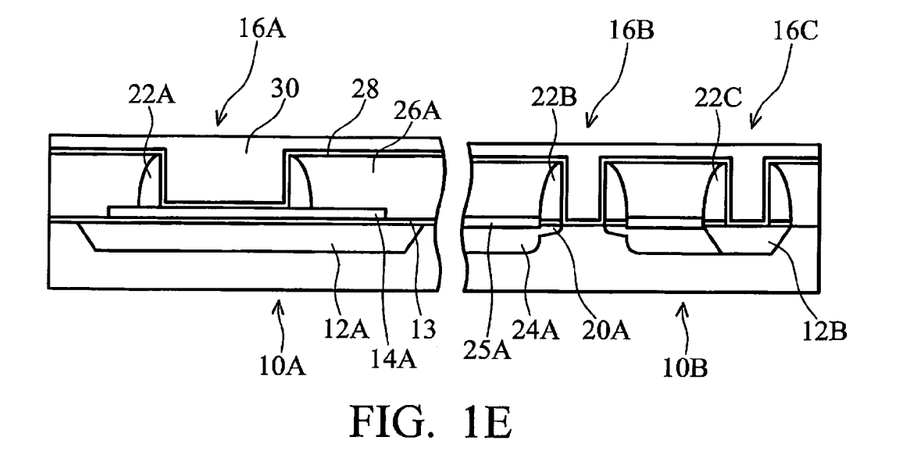

Referring to FIG. 1E, a dielectric film 28, preferably a high-K dielectric film, for example, with a dielectric constant greater than about 10, more preferably greater than about 20, is then conformally deposited by conventional processes, e.g., PVD, CVD, processes including atomic layer (ALCVD) to line (cover sidewall and bottom portions) the gate electrode openings e.g., 19A, 19B, and 19C. The high-K dielectric material film 28, for example, may include, but is not limited to high-K dielectrics such as tantalum oxide (e.g., $TaO_2$), tantalum pentaoxide (e.g., $Ta_2O_5$), hafnium oxide (e.g., $HfO_2$), aluminum oxide (e.g., $Al_2O_3$), indium oxide (e.g., $InO2$), lanthanum oxide (e.g., $LaO_2$), zirconium oxide (e.g., $ZrO_2$), yttrium oxide (e.g., $Y_2O_3$), and combinations thereof. It will be appreciated by those skilled in the art that the thickness of the film will depend in part on design constraints of the CMOS gate dielectric structures as well as a desired capacitance of an MIM structure, e.g., 50 Angstroms to 1000 Angstroms.

Still referring to FIG. 1E, following deposition of the high-K dielectric film 28, an upper conductor material layer 30, preferably including a metal, including the same or different conductor material as that used for the bottom electrode 14A, is deposited by conventional processes e.g., one or more of CVD, PVD, or electrodeposition, to fill the remaining portions of the gate structure openings over the high-K dielectric film. Conductor material layer 30 formation will additionally include forming an excess thickness portion overlying the surface in a blanket deposition process. A metal conductor material is preferred for reduced electrical resistance in high speed applications.

Figure 1F:
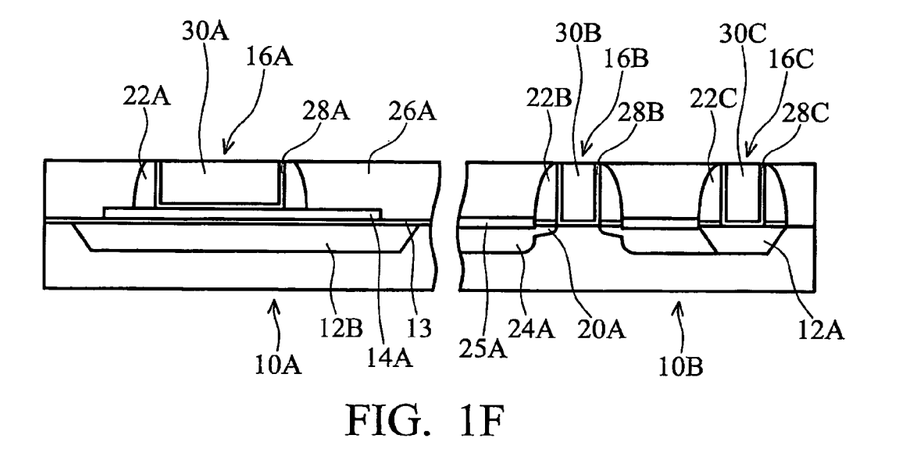

Referring to FIG. 1F, a planarizing process, preferably a CMP process, is then carried out to remove excess conductor material layer 30 and excess dielectric film 28 overlying the insulator layer 26A surface, to simultaneously planarize and complete formation of MIM capacitor structure (formerly dummy gate structure 16A) with an upper metal conductor electrode 30A over a dielectric capacitor element 28A in mixed mode region 10A. Gate structures 16B and 16C including metal conductor gate electrodes 30B and 30C are simultaneously formed over the logic region 10B and over respective gate dielectric portions 28B and 28C, wherein the gate electrode 30B is a real gate electrode. It will be appreciated by those skilled in the art that the MIM capacitor and gate structures will be about co-planar following the CMP planarization process.

Figure 1G:
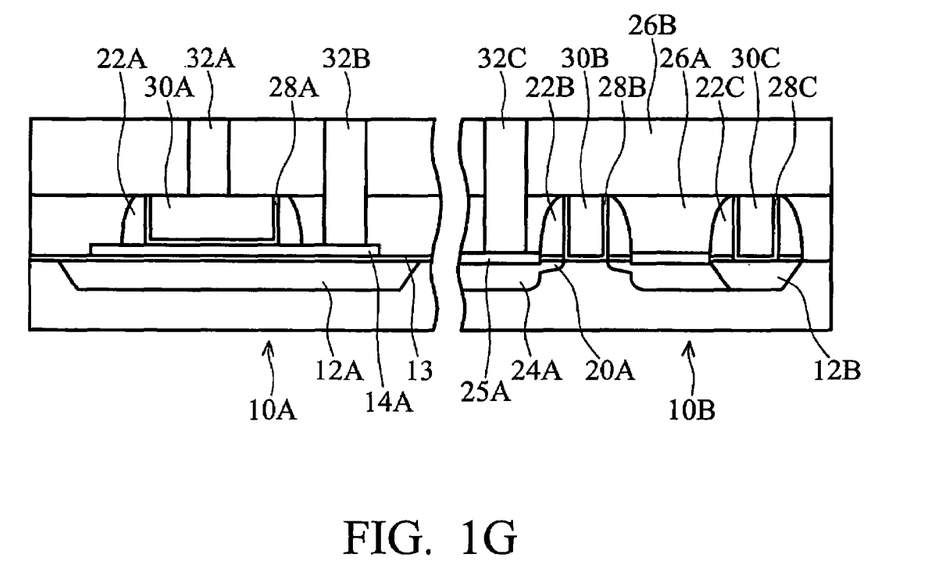

Referring to FIG. 1G, conventional processes are then carried out to form a second insulator (e.g., ILD) layer 26B including the same or different material as first insulator layer 26A is then formed over the MIM capacitor structure 16A and gate structures 16B and 16C, followed by formation of conductive contacts by a damascene process, e.g., 32A, 32B, to make electrical contact with the MIM capacitor electrodes, and 32C to make electrical contact with the source/drain regions e.g., 24A of active transistor structure 16B.

Figure 2:
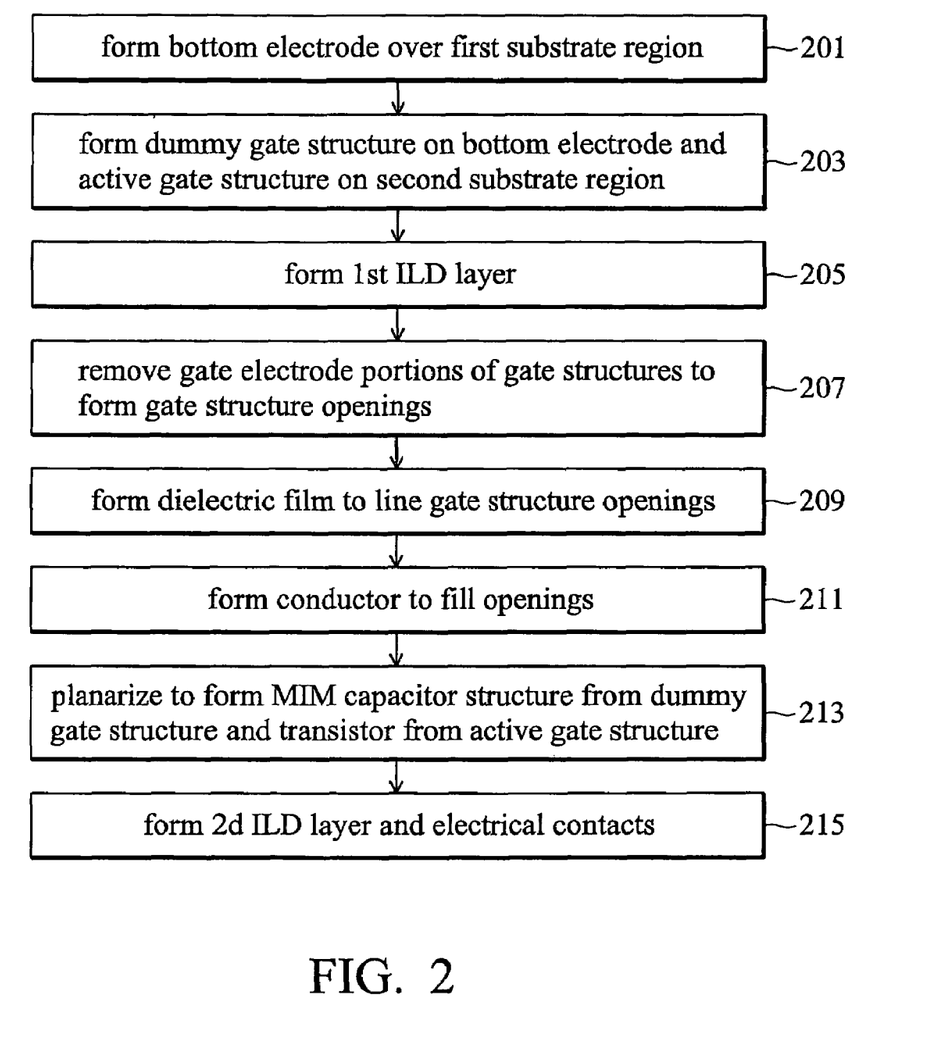
FIG. 2 is a process flow diagram including several embodiments of the invention.

FIG. 2 is a process flow diagram including several embodiments of the invention. In process 201, a bottom electrode conductor is formed over an insulator region including a first region of a substrate. In process 203, a dummy gate structure is formed over the bottom electrode in parallel with formation of an active gate structure on a second region of the substrate. In process 205, a first ILD layer is formed adjacent gate structures. In process 207, the gate electrode portions of the gate structures are removed to form respective gate structure openings. In process 209, a high-K dielectric film is formed to line the first and second gate structure openings. In process 211, a second conductor is formed to fill the first and second gate structure openings. In process 213, a planarization process (CMP) is performed to remove excess second conductor and high-K dielectric over the surface to form an MIM capacitor from the dummy gate structure and a CMOS transistor from the active gate structure. In process 215, a second ILD layer is formed to include electrical contacts to the MIM capacitor electrodes and the CMOS transistor.

Thus a device, such a mixed analog/digital (logic) device, an RF analog device, or a DRAM device including both an MIM capacitor structure and CMOS gate structure are achieved. The MIM capacitor and CMOS gate structure are formed in parallel with reduced processing steps and improved device performance. The CMOS gate structure and MIM capacitor electrodes with a metal conductor material, for example, improve the performance (e.g., operating speed) of the CMOS gate structure, thereby improving the operation of the mixed mode device. A conductor (e.g., metal) CMOS gate electrode, e.g., a metal-oxide-semiconductor (MOSFET) improves device speed by overcoming the depletion effects of polysilicon. Formation of the MIM capacitor formed by parallel compatible processes reduces the number of required processing steps and improves voltage-capacitance linearity. By utilizing the same high-K dielectric film for the MIM capacitor and the CMOS gate dielectric, processing steps are further reduced, and the capacitance of the MIM structure and the performance of the CMOS gate structure are improved, e.g. short channel effects (SCE) are reduced. Thus, both the MIM capacitor and CMOS gate structure can be scaled down with reduced cost and achieve gate improved performance for high speed applications.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A device comprising:
    a substrate comprising a first insulator region and a second insulator region;
    a bottom electrode, comprising a first conductor, overlying the first insulator region;
    an insulator layer overlying the substrate and the bottom electrode, wherein the insulator layer comprises a first opening connecting parts of the bottom electrode and a second opening connecting parts of the second insulator region;
    a dielectric film lining the first and second openings, and disposed directly on the bottom electrode, the second insulator region, and sidewalls of the first and second openings;
    a top electrode, comprising a second conductor, overlying the dielectric film in the first opening, wherein the dielectric film lines sidewalls and bottom of the top electrode; and a metal gate electrode, comprising the second conductor, overlying the dielectric film in the second opening, wherein the dielectric film lines sidewalls and bottom of the metal gate electrode, wherein the metal gate electrode and the top electrode substantially have the same thickness, and the first insulator region and the second region substantially have the same depth.

2. The device of claim 1, further comprising first sidewall spacers overlying the bottom electrode and sidewalls of the top electrode, and second sidewall spacers overlying the substrate and sidewalls of the metal gate electrode.

3. The device of claim 1, further comprising conductive contacts electrically contacting the bottom and top electrodes.

4. The device of claim 1, further comprising a dummy dielectric layer between the insulator region of the substrate and the bottom electrode.

5. The device of claim 1, wherein the first and second conductors comprise metal.

6. The device of claim 1, wherein the dielectric film comprises a high-K dielectric film.

7. The device of claim 1, wherein formation of the dielectric film and the top electrode comprises the steps of:

forming a gate structure and the insulator layer overlying the bottom electrode;

removing gate electrode portions of the gate structure, forming the first opening exposing the bottom electrode;

forming the dielectric film lining the first opening, and being disposed directly on the bottom electrode and sidewalls of the first opening; and forming the second conductor filling the first opening, completing the top electrode.

8. A device comprising a capacitor and a transistor, comprising:

a substrate comprising a mixed mode region adjacent to a logic circuit region;

a bottom electrode, comprising a first metal, overlying a first insulator region in the mixed mode region;

a first insulator layer overlying the mixed mode region, the logic circuit region, and the bottom electrode, wherein the first insulator layer comprises a first opening connecting parts of the bottom electrode, and a second opening and a third opening respectively connecting a semiconductor region and a second insulator region in the logic circuit region of the substrate;

a dielectric film lining the first, second and third openings, disposed directly on the bottom electrode and sidewalls of the first, second and third openings, and overlying the semiconductor region and the second insulator region in the logic circuit region, respectively acting as a capacitor dielectric film and a gate dielectric in the mixed mode region and the logic circuit region;

a second metal overlying the dielectric film, respectively acting as a top electrode of a capacitor structure in the mixed mode region in the first opening, a first metal gate electrode acting as a real gate electrode of a transistor structure in the logic circuit region in the second opening, and a second metal gate electrode in the third opening, wherein the dielectric film lines sidewalls of the top electrode and the first and second metal gate electrodes; and a second insulator layer overlying the capacitor structure and the transistor structure, wherein the second metal gate electrode and the top electrode substantially have the same thickness, and the first insulator region and the second region substantially have the same depth.

9. The device of claim 8, further comprising:

first sidewall spacers overlying the bottom electrode and sidewalls of the top electrode;

second side wall spacers overlying the substrate and sidewalls of the real gate electrode; and third side wall spacers overlying the substrate and sidewalls of the second metal gate electrode.

10. The device of claim 8, further comprising:

a first conductive contact, embedded in the insulator layer, electrically contacting the capacitor structure; and a second conductive contact, embedded in the insulator layer, electrically contacting the transistor structure.

11. The device of claim 8, wherein the dielectric film comprises a high-K dielectric film.

12. The device of claim 8, wherein the top electrode and the real gate electrode are substantially co-planar.

13. The device of claim 8, wherein formation of the top electrode and the first and second metal gate electrodes comprises the steps of:

forming a first gate structure overlying the bottom electrode while simultaneously forming a second gate structure overlying the semiconductor region in the logic circuit region and a third gate structure on the second insulator region of the logic circuit region;

forming the first insulator layer overlying the substrate beyond the first, second and third gate structures;

removing gate electrode portions of the first, second and third gate structures, respectively forming the first opening and the second opening in the first insulator layer, respectively exposing the bottom electrode, the semiconductor region and the second insulator region;

forming the dielectric film lining the first, second and third openings, respectively forming a capacitor element overlying the bottom electrode while simultaneously forming the gate dielectric overlying the logic circuit region, wherein the dielectric film is disposed directly on the bottom electrode and sidewalls of the first, second and third openings; and forming the second metal filling the first and second openings, completing the top electrode and the first and second metal gate electrodes.

14. A device comprising a capacitor and a transistor comprising:

a substrate comprising a semiconductor region between a first insulator region and a second insulator region;

a bottom electrode, comprising a first conductor, disposed on the first insulator region;

an insulator layer overlying the first and second insulator regions, the semiconductor region, and the bottom electrode, wherein the insulator layer comprises a first opening connecting parts of the bottom electrode, a second opening connecting the semiconductor region, and a third opening connecting the second insulator region;

a dielectric film lining the first, second and third openings, and disposed on the bottom electrode and the semiconductor region and the second insulator regions, respectively acting as a capacitor dielectric film and a gate dielectric, wherein the dielectric film is disposed directly on sidewalls of the first, second and third openings; and a second conductor disposed on the capacitor dielectric film and the gate dielectric in the first, second and third openings, respectively acting as a top electrode of a capacitor structure, a first metal gate electrode acting as a real gate electrode of a transistor structure, and a second metal gate electrode in the third opening, wherein the second metal gate electrode and the top electrode substantially have the same thickness, and the first insulator region and the second region substantially have the same depth.

15. The device of claim 14, wherein the dielectric film lines sidewalls of the top electrode and the first and second metal gate electrodes.

16. The device of claim 14, further comprising a first conductive contact electrically contacting the capacitor structure, and a second conductive contact electrically contacting the transistor structure.

17. The device of claim 14, wherein the top electrode and the real gate electrode are substantially co-planar.

18. The device of claim 14, wherein the first and second conductor comprises a metal.

19. The device of claim 14, wherein the dielectric film comprises a high-K dielectric film.

20. The device of claim 14, wherein formation of the top electrode and the first and second metal gate electrodes comprises the steps of:

forming the dielectric layer overlying the bottom electrode and the semiconductor region and the second insulator region, respectively acting as the capacitor dielectric film and the gate dielectric; and forming the second conductor overlying the capacitor dielectric film and the gate dielectric, respectively acting as the top electrode and the first and second metal gate electrodes.

* * * * *